(12) United States Patent
Kim et al.

(10) Patent No.: US 9,730,323 B2
(45) Date of Patent: Aug. 8, 2017

(54) SEMICONDUCTOR PACKAGE

(71) Applicant: Samsung Electronics Co., Ltd., Suwon-si (KR)

(72) Inventors: Jin Gyu Kim, Asan-si (KR); Jung Woo Kim, Siheung-si (KR); Tae Hun Kim, Asan-si (KR); Kyoung Sei Choi, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 190 days.

(21) Appl. No.: 14/480,661

(22) Filed: Sep. 9, 2014

(65) Prior Publication Data

US 2015/0245487 A1 Aug. 27, 2015

(30) Foreign Application Priority Data

Feb. 25, 2014 (KR) ........................ 10-2014-0022114

(51) Int. Cl.
*H05K 7/00* (2006.01)
*H05K 1/14* (2006.01)
(Continued)

(52) U.S. Cl.
CPC .......... *H05K 1/144* (2013.01); *H01L 25/0652* (2013.01); *H05K 1/186* (2013.01); *H01L 23/49811* (2013.01); *H01L 23/5385* (2013.01); *H01L 23/5386* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2924/181* (2013.01); *H05K 1/181* (2013.01); *H05K 2201/042* (2013.01); *H05K 2201/10674* (2013.01)

(58) Field of Classification Search
CPC . H01L 2224/32225; H01L 2224/48091; H01L 2224/48227; H01L 2224/73265; H01L 2924/181; H01L 2924/00; H01L 2924/00012; H01L 2924/00014; H01L 2224/16225; H01L 23/5389; H05K 1/144; H05K 1/181
See application file for complete search history.

(56) References Cited

U.S. PATENT DOCUMENTS 6,268,649 B1 * 7/2001 Corisis ................ H01L 23/3107
257/685
6,372,608 B1 4/2002 Shimoda et al.
(Continued)

FOREIGN PATENT DOCUMENTS

KR 10-2008-0077837 A 8/2008
KR 10-2012-0078390 7/2012
(Continued)

*Primary Examiner* — Yuriy Semenenko
(74) *Attorney, Agent, or Firm* — Muir Patent Law PLLC (57) ABSTRACT

A semiconductor package may include a plurality of first semiconductor package mounted on a first region of a first surface of a first circuit board, a plurality of terminals disposed between the plurality of first semiconductor chips on a second region of the first surface of the first circuit board, and at least one second semiconductor chip mounted on a second circuit board connected to the first circuit board through the plurality of terminals.

19 Claims, 9 Drawing Sheets

(51) Int. Cl.
  *H01L 25/065* (2006.01)
  *H05K 1/18* (2006.01)
  *H01L 23/498* (2006.01)
  *H01L 23/538* (2006.01)

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,737,539 B2 | 6/2010 | Kwon et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,816,183 B2 | 10/2010 | Kawata | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,619,431 B2 | 12/2013 | Lin et al. | |
| 2003/0137041 A1* | 7/2003 | Blackshear | G11C 5/04 257/686 |
| 2006/0220224 A1* | 10/2006 | Cheng | H01L 25/105 257/706 |
| 2007/0164457 A1 | 7/2007 | Yamaguchi et al. | |
| 2010/0148359 A1 | 6/2010 | Quevedo et al. | |
| 2011/0037157 A1* | 2/2011 | Shin | H01L 23/49833 257/686 |
| 2011/0248389 A1* | 10/2011 | Yorita | H01L 23/3677 257/659 |
| 2012/0168917 A1 | 7/2012 | Yim et al. | |
| 2013/0009308 A1 | 1/2013 | Kwon | |
| 2013/0015591 A1* | 1/2013 | Haba | H01L 24/06 257/778 |
| 2013/0175687 A1* | 7/2013 | Hu | H01L 21/56 257/738 |

FOREIGN PATENT DOCUMENTS

| | | |
|---|---|---|
| KR | 10-2013-0005465 | 1/2013 |
| KR | 10-2013-0040071 A | 4/2013 |

* cited by examiner

SEMICONDUCTOR PACKAGE

CROSS-REFERENCE TO RELATED APPLICATIONS

This application claims priority under U.S.C §119 to Korean Patent Application No. 10-2014-0022114, filed on Feb. 25, 2014, with the Korean Intellectual Property Office, the entire disclosure of which is incorporated herein by reference.

BACKGROUND

The present disclosure relates to an electronic device such as a semiconductor package.

In general, semiconductor packages have a structure including a substrate such as a circuit board and a semiconductor chip mounted on the circuit board. In accordance with the recent trend toward the integration and miniaturization of electronic devices, a method of stacking other semiconductor packages on a single semiconductor package has been proposed. Therefore, research into a scheme capable of improving reliability in electrical connections between different semiconductor packages is in demand.

SUMMARY

Some embodiments of the present disclosure may provide a package-on-package (POP)-type semiconductor package having improved electrical connection reliability.

Some embodiments of the present disclosure may provide a semiconductor package capable of being implemented as a system-in-package (SIP) semiconductor package having improved reliability.

According to some embodiments of the present disclosure, a semiconductor package may include a plurality of first semiconductor chips mounted on a first region of a first surface of a first circuit board, a plurality of terminals disposed between the plurality of first semiconductor chips on a second region of the first surface of the first circuit board, and at least one second semiconductor chip mounted on a second circuit board connected to the first circuit board through the plurality of terminals.

The second region may be surrounded by the first region.

A center of the first surface of the first circuit board may be located in the second region.

In this case, the center of the first surface of the first circuit board may be positioned to correspond to a center of the second region.

Unlike this case, the center of the first surface of the first circuit board may be positioned to be spaced apart from a center of the second region.

The first region may include a first sub region adjacent to sidewalls of the first circuit board and a second sub region spaced apart from the first sub region, and the second region may be provided between the first sub region and the second sub region.

At least one of the plurality of first semiconductor chips may have a size different from the size of the remaining first semiconductor chips.

The first circuit board may have a first sidewall and a second sidewall opposing each other, and a third sidewall and a fourth sidewall intersecting the first and second sidewalls and opposing each other, and the plurality of first semiconductor chips may be disposed such that respective at least first sides of the plurality of first semiconductor chips may be adjacent to the first sidewall or the second sidewall of the first circuit board.

The plurality of terminals may be disposed in an array of rows and columns on the first circuit board.

In this case, a plurality of outermost terminals among the plurality of terminals may be disposed to be adjacent to respective sides of the plurality of first semiconductor chips.

The plurality of terminals may be disposed in an array of n×m (n and m being integers equal to or greater than 2, respectively), and in the array of n×m, at least one of a first row and an n-th row may be adjacent to the third sidewall or the fourth sidewall of the first circuit board, and at least one of a first column and an m-th column may be adjacent to at least one of the plurality of first semiconductor chips.

The number of the plurality of terminals disposed on the first circuit board may be greater toward a central portion of the first surface of the first circuit board than in regions of the first circuit board adjacent to the third and fourth sidewalls.

At least portions of the plurality of terminals may be disposed below the second semiconductor chip.

The plurality of first semiconductor chips may include at least two chips selected from types of chips including: a memory chip, a logic chip and a microprocessor chip.

The plurality of first semiconductor chips may include semiconductor chips having different functions, and the first package may be implemented as a system-in-package (SIP).

At least one of the plurality of first semiconductor chips may include a semiconductor chip having a function different from that of the second semiconductor chip, and the semiconductor package may be a package-on-package (POP)-type package.

The second circuit board may be disposed on the first circuit board and may include a plurality of pads disposed in positions of the second circuit board corresponding to positions of the plurality of terminals.

The semiconductor package may further include an encapsulating part disposed between the first circuit board and the second circuit board.

According to some embodiments of the present disclosure, a semiconductor package may include a first package including a plurality of first semiconductor chips and a plurality of terminals horizontally disposed on a first circuit board to be spaced apart from one another, and a second package mounted on the first package and including at least one second semiconductor chip disposed on a second circuit board, wherein the plurality of terminals are electrically connected to the first and second packages, and at least portions of the plurality of terminals are disposed in a central region of the first circuit board.

According to some embodiments of the present disclosure, a semiconductor package may include a first package including a first circuit board and a plurality of first semiconductor chips horizontally disposed on the first circuit board to be spaced apart from one another, a second package disposed on the first package and including a second circuit board and at least one second semiconductor chip disposed on the second circuit board, and a plurality of terminals electrically connected to the first and second packages to each other, the plurality of terminals disposed on the first circuit board and substantially encompassed by the plurality of first semiconductor chips.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein.

In the drawings, the shapes and dimensions of elements may be exaggerated for clarity, and the same reference numerals will be used throughout to designate the same or like elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another, for example as a naming convention. For example, a first chip could be termed a second chip, and, similarly, a second chip could be termed a first chip without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1:
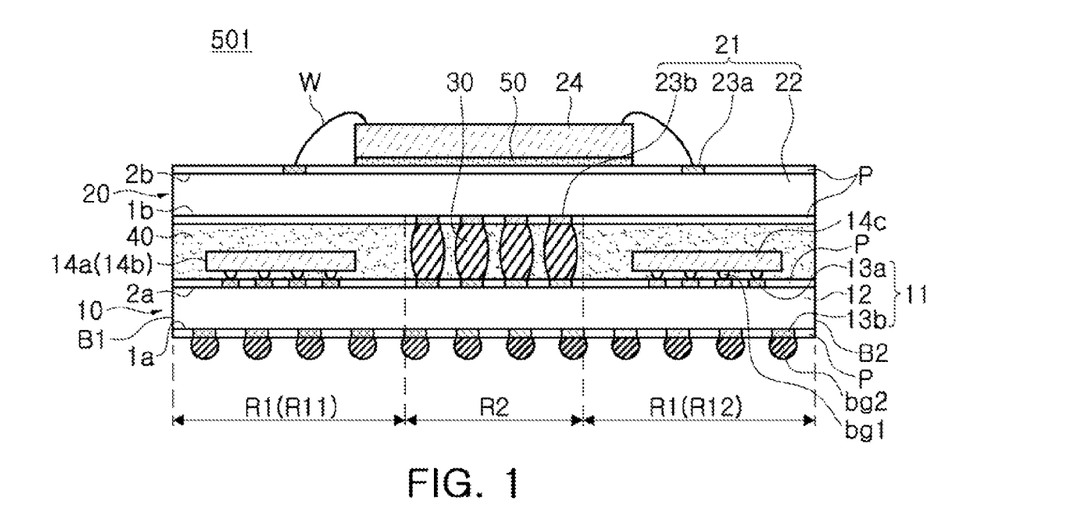
FIG. 1 is a cross-sectional view of a semiconductor package according to an exemplary embodiment of the present disclosure.
Figure 2:
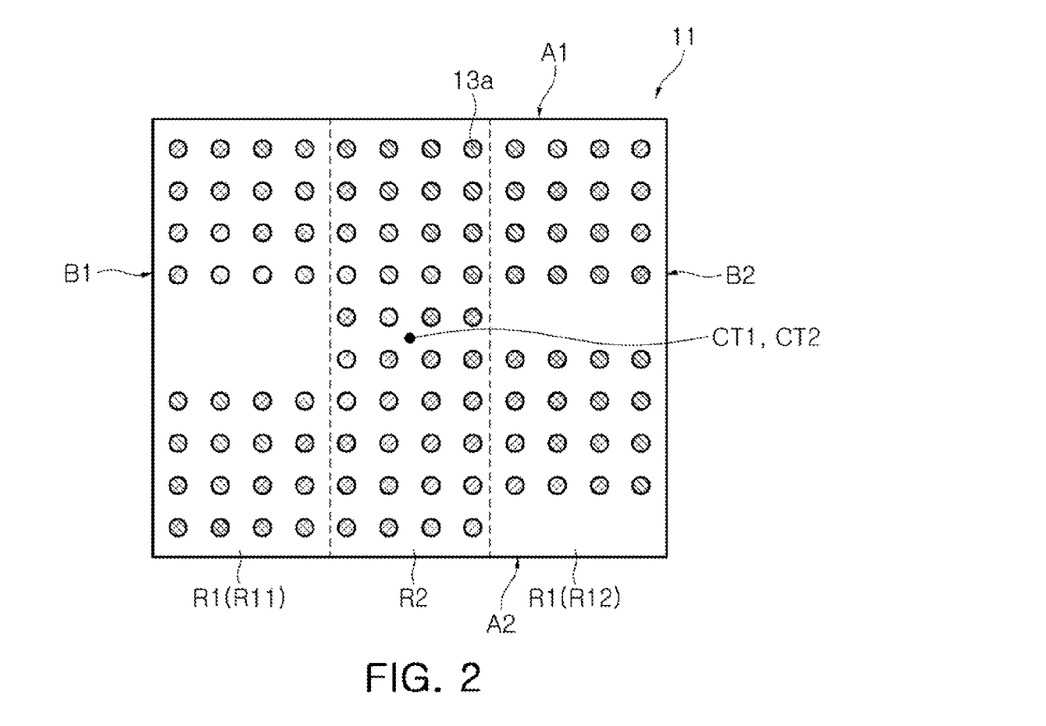
FIGS. 2 to 6 are plan views and cross-sectional views illustrating a method of manufacturing a semiconductor package of FIG. 1 according to an exemplary embodiment of the present disclosure.

FIG. 1 is a cross-sectional view of a semiconductor package 501 according to an exemplary embodiment of the present disclosure. FIG. 2 is a plan view of a first circuit board 11 of FIG. 1 according to the exemplary embodiment of the present disclosure. As used herein, the term electronic device may be generally used to refer to a semiconductor chip, a semiconductor package, a semiconductor package-on-package device, a semiconductor module, a computer, a cellular phone, a tablet, or other such devices. The term semiconductor device is used herein to refer to a semiconductor chip or stack of chips, a semiconductor package, or a semiconductor package-on-package device. A package-on-package device may also be referred to herein as a package. In general, a package includes a package substrate, and one or more of elements mounted on the package substrate (e.g., one or more chips, or other packages). In some embodiments, the package may be encapsulated with an encapsulation layer.

With reference to FIGS. 1 and 2, a semiconductor device such as the semiconductor package 501 according to an exemplary embodiment of the present disclosure may include a first package 10, a second package 20, and a plurality of terminals 30 electrically connecting the first package 10 and the second package 20 to each other. The first package 10 may be a lower package and the second package 20 may be an upper package.

Figure 3:
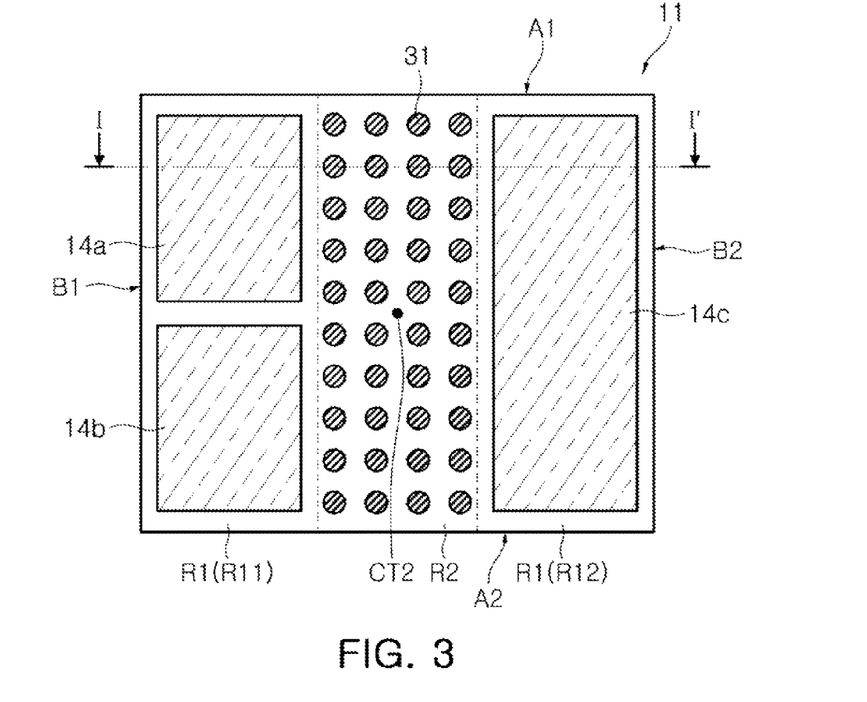

The first package 10 may include a first circuit board 11 and a plurality of first semiconductor chips 14a, 14b and 14c disposed on the first circuit board 11. As illustrated in FIG. 3, the first semiconductor chips 14a, 14b and 14c may be horizontally disposed to be spaced apart from one another on the first circuit board 11. Each semiconductor chip may be formed, for example, from a wafer, and may be formed using a die.

The first circuit board 11 may include a first core insulating layer 12 having a first surface 1a and a second surface 2a opposing the first surface 1a, and first lower pads 13b and first upper pads 13a disposed on the first surfaces 1a and the second surface 2a of the first core insulating layer 12, respectively. The first core insulating layer 12 may include a plurality of semiconductor chips 14a, 14b and 14c disposed in the first package and/or a circuit pattern for forming an electrical connection to the second package 20 stacked on the first package 10. The circuit pattern may be formed in at least one of the first surface 1a, the second surface 2a of the first core insulating layer 12, and the inside thereof.

The first core insulating layer 12 may contain an insulating material capable of preventing the occurrence of unnecessary electrical short circuits in the circuit pattern, for example, at least one of a prepreg resin, a thermosetting epoxy resin, a thermoplastic epoxy resin, and a resin containing a filler.

The first upper pads 13a may be bonding regions for a flip-chip or wire W bonded to the plurality of first semiconductor chips 14a, 14b and 14c, or may be provided as regions in which the terminals 30 are to be disposed for connection to the second package 20, and may contain a conductive material. The first upper pads 13a may contain a metal such as gold (Au), silver (Ag), nickel (Ni), or palladium (Pd), but are not limited thereto. The first lower pads 13b may provide regions thereof in which package bumps bg2 for communication with an external device are disposed. The first lower pads 13b may be formed using the same material as that of the first upper pads 13a, but are not limited thereto. For example, the first lower pads 13b may be formed using a material different from that of the first upper pads 13a.

The package bump bg2 may include a plurality of solder balls. The plurality of solder balls may be disposed to have a form of grid, but are not limited thereto. In addition, the package bump bg2 may be provided as, for example, one of a conductive bump, a conductive spacer, and a pin grid array (PGA). The different conductive connections described herein, such as bumps, balls, pads, and the like, or combinations thereof when connected to each other, are generally referred to as terminals, conductive terminals, or conductive connectors. Terminals on an outside of a device may be referred to as external terminals, with respect to that device. Terminals within a device may be referred to as internal terminals.

A passivation layer P may be disposed on at least one of the first surface 1a or the second surface 2a. The passivation layer P may be formed using an insulating material to prevent the occurrence of unnecessary electrical short circuits, and upper surfaces of the first upper pads 13a and the first lower pads 13b may be exposed. The passivation layer P may contain, for example, a solder resist layer.

The first circuit board 11 may include a first region R1 and a second region R2, the second region R2 including remaining regions of the circuit board except for the first region R1. The first circuit board 11 may be considered as being divided into the first and second regions R1 and R2 not overlapping with each other. According to an exemplary embodiment of the present disclosure, the first region R1 may include regions respectively adjacent to a pair of sidewalls, for example, a first sidewall B1 and a second sidewall B2 of the first circuit board 11, regions respectively adjacent to portions of another pair of sidewalls, for example, a third sidewall A1 and a fourth sidewall A2 intersecting the pair of sidewalls B1 and B2, and two regions spaced apart from each other, for example, a first sub region R11 and a second sub region R12. The second region R2 may be provided between the first and second sub regions R11 and R12 of the first region R1, and may include regions adjacent to the third sidewall A1 and the fourth sidewall A2. For example, the first region R1 may be an edge portion of the first circuit board 11, and the second region R2 may be a central portion thereof. The plurality of first semiconductor chips 14a, 14b and 14c may be disposed in the first region R1, and the plurality of terminals 30 may be disposed in the second region R2.

Figure 13:
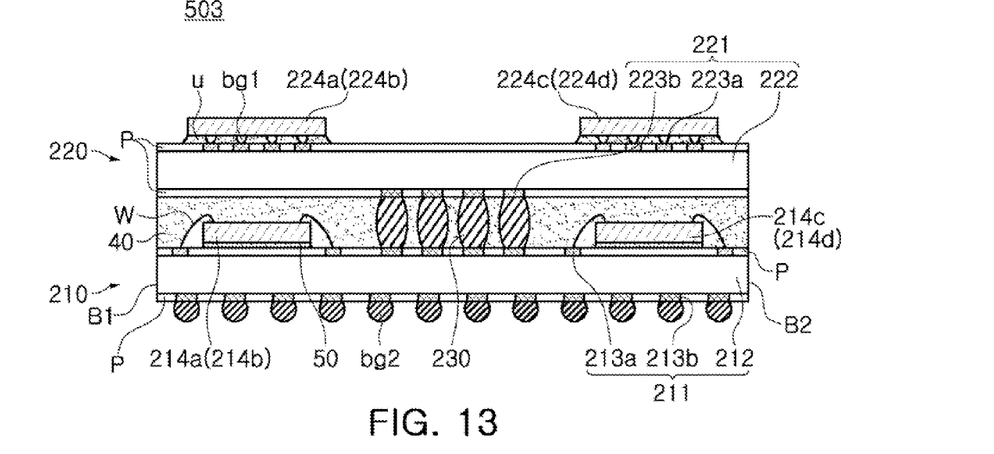
FIGS. 13, 14 and 15 are cross-sectional views and plan views illustrating a semiconductor package according to another exemplary embodiment of the present disclosure.

At least one of the plurality of first semiconductor chips 14a, 14b and 14c may be a flip-chip mounted on the first region R1 of the first circuit board 11, and may be electrically connected to the first circuit board 11 through the chip bumps bg1. In this case, the chip bumps bg1 may include solder balls. Unlike this case, at least one of the plurality of first semiconductor chips 14a, 14b and 14c may also be electrically connected to the first circuit board 11 through wire (W) bonding as illustrated in FIG. 13.

The plurality of first semiconductor chips 14a, 14b and 14c may be, for example, a volatile memory chip such as a dynamic random access memory (DRAM) and a static random access memory (SRAM), a non-volatile memory chip such as a flash memory, a magnetoresistive random access memory (MRAM) and a resistive random access memory (RRAM), a logic chip and a microprocessor chip, a system-on-chip, or the like. The plurality of first semiconductor chips 14a, 14b and 14c may be semiconductor devices having different functions, by which the first package 10 may be implemented as a system-in-package (SIP), but are not limited thereto. For example, all of the plurality of first semiconductor chips 14a, 14b and 14c may be implemented as semiconductor devices having the same function.

The plurality of terminals 30 electrically connecting the first and second packages 10 and 20 to each other may be disposed in the second region R2. According to the exemplary embodiment of the present disclosure, the plurality of terminals 30 may be disposed between the plurality of first semiconductor chips 14a, 14b and 14c. In addition, at least a portion of the plurality of terminals 30 may be disposed in a central region of the first circuit board 11. Technical effects thereof and a detailed description thereof will be provided below with reference to FIGS. 7 and 8. The plurality of terminals 30 may include, for example, a plurality of solder bumps, and may be disposed in certain embodiments in the form of a grid. In addition, the plurality of terminals 30 may include one or more of a conductive bump, a conductive spacer and a pin grid array.

The second package 20 may be disposed on the first package 10, and may include a second circuit board 21 and at least one second semiconductor chip 24 disposed on the second circuit board 21.

The second circuit board 21 may include a second core insulating layer 22 having a first surface 1b and a second surface 2b opposing the first surface 1b, and second lower pads 23b and second upper pads 23a disposed on the first surfaces 1b and the second surface 2b of the second core insulating layer 22, respectively. The second core insulating layer 22 may include a circuit pattern for forming an electrical connection to at least one second semiconductor chip 24 disposed on the first package 10 and/or the second package 20. The circuit pattern may be formed in at least one of the first surface 1b, the second surface 2b of the second core insulating layer 22, and the inside thereof.

The second core insulating layer 22 may contain an insulating material capable of preventing the occurrence of unnecessary electrical short circuits in the circuit pattern, for example, at least one of a prepreg resin, a thermosetting epoxy resin, a thermoplastic epoxy resin, and a resin containing a filler.

The second upper pads 23a may be bonding regions for a flip-chip or a wire (W) bonded to the at least one second semiconductor chip 24, but are not limited thereto. For example, when an additional package is stacked on the second package 20, the second upper pads 23a may also be provided as regions in which terminals provided for forming an electrical connection to the different package are to be disposed. The second upper pads 23a may contain a metal such as copper (Cu), aluminum (Al), gold (Au), silver (Ag), nickel (Ni), or palladium (Pd).

Figure 11:
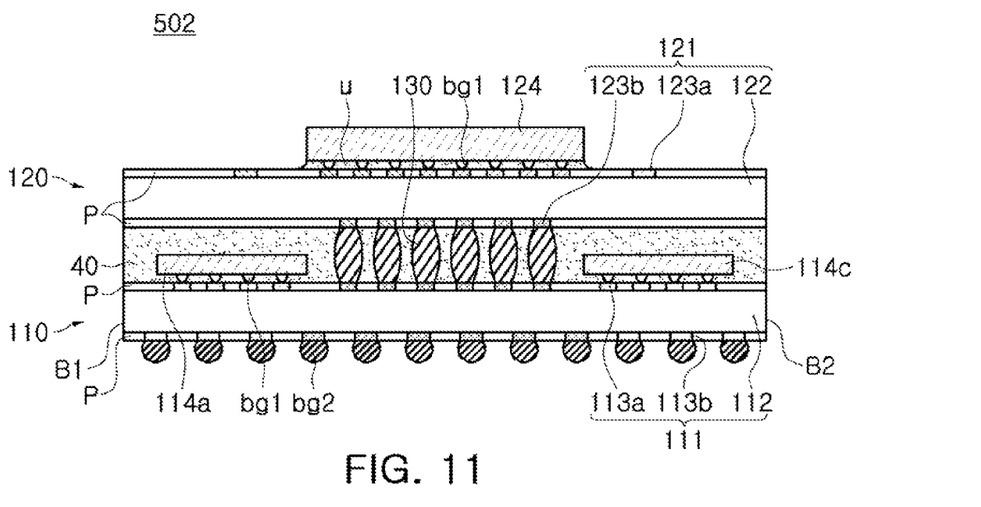
FIGS. 11 and 12 are a cross-sectional view and a plan view illustrating a semiconductor package according to another exemplary embodiment of the present disclosure.

The second semiconductor chip 24 may be fixed to an upper portion of the second circuit board 21 via an adhesive portion 50, and may be electrically connected to the second circuit board 21 via the second upper pads 23a by wire (W) bonding. Unlike this, the second semiconductor chip 124 may also be flip-chip mounted and electrically connected to the second circuit board 121 via the chip bumps bg1 and the second upper pads 23a, as illustrated in FIG. 11. In certain embodiments, the adhesive portion 50 may include at least one of a conductive metal paste, an insulating epoxy resin and an insulating tape. One exemplary embodiment of the present disclosure illustrates the case in which the plurality of terminals 30 are disposed below the second semiconductor chip 24, but the present disclosure is not limited thereto.

The second semiconductor chip 24 may be, for example, a volatile memory chip such as a DRAM or an SRAM, a non-volatile memory chip such as a flash memory, an MRAM or a RRAM, a logic chip or a microprocessor chip, a system-on-chip, or the like.

According to one exemplary embodiment of the present disclosure, the second circuit board 21 may include a plurality of pads disposed on a surface thereof facing the first circuit board 11 to contact the plurality of terminals 30 to form an electrical connection between the first package 10 and the second package 20. The plurality of pads may be, for example, the second lower pads 23b disposed on the first surface 1b of the second core insulating layer 22. The plurality of pads (the second lower pads 23b) may be formed on positions of, for example, the first surface 1b, corresponding to those of the plurality of terminals 30. For example, in a case in which the plurality of terminals 30 are disposed in a central region of the first circuit board 11, the second lower pads 23b may be disposed in regions corresponding thereto, for example, in a central region of the second circuit board 21.

The second lower pads 23b may be formed using the same material as that of the second upper pads 23a. Unlike that, the second lower pads 23b may contain a conductive material different from that of the second upper pads 23a.

A passivation layer P may be disposed on at least one of the first surface 1b and the second surface 2b of the second circuit board 21. The passivation layer P may be formed, for example, using an insulating material to prevent the occurrence of unnecessary electrical short circuits, and upper surfaces of the second upper pads 23a and the second lower pads 23b may be exposed. The passivation layer may contain, for example, a solder resister layer.

An encapsulating part 40 sealing the plurality of first semiconductor chips 14a, 14b and 14c may be disposed between the first and second packages 10 and 20. The encapsulating part 40 may have a function of adhering the first and second packages 10 and 20 to each other and the plurality of first semiconductor chips 14a, 14b and 14c to the first circuit board 11. The encapsulating part 40 may contain a resin such as an epoxy or the like.

Hereinafter, referring to FIGS. 2 to 6, a method of manufacturing the semiconductor package 501 according to one exemplary embodiment of the present disclosure with reference to FIG. 1 and detailed structural characteristics thereof will be described. Descriptions of constituent elements overlapping those of the constituent elements according to the foregoing exemplary embodiment of the present disclosure with reference to FIG. 1 will be omitted, and characteristic portions will be mainly provided.

FIGS. 3 to 6 are plan views and cross-sectional views illustrating a method of manufacturing a semiconductor package 501 provided according to one exemplary embodiment of the present disclosure.

With reference to FIGS. 2 to 6, a method of manufacturing a semiconductor package 501 according to an exemplary embodiment of the present disclosure may include preparing a first circuit board 11.

With reference to FIG. 2, the first upper pads 13a provided for an electrical connection to the plurality of first semiconductor chips 14a, 14b and 14c and the plurality of terminals 30 to be formed in a subsequent process, may be disposed on the first circuit board 11.

The first circuit board 11 may include a first region R1 and a second region R2, the second region R2 including remaining portions of the circuit board except for the first region R1. The first region R1 may include first and second sub regions R11 and R12 extended along a pair of first and second sidewalls B1 and B2 of the first circuit board 11 opposing each other to be adjacent thereto, respectively. The second region R2 may be provided between the sub regions of the first region R1 separated from each other. The first region R1 and the second region R2 may be formed adjacently to third and fourth sidewalls A1 and A2 intersecting the first and second sidewalls B1 and B2 of the first circuit board 11. The first upper pads 13a disposed in the first region R1 may be provided for forming an electrical connection to the plurality of first semiconductor chips 14a, 14b and 14c, and the first upper pads 13a disposed in the second region R2 may be provided for forming an electrical connection to the plurality of terminals 30. The second region R2 may be disposed between the first and second sub regions R11 and R12 of the first region R1.

According to an exemplary embodiment of the present disclosure, a center CT1 of an upper surface of the first circuit board 11 may be positioned in the second region R2. In detail, the center CT1 of upper surface of the first circuit board 11 may be located to correspond to a center CT2 of the second region R2 as illustrated in the drawings, but is not limited thereto.

Figure 4:
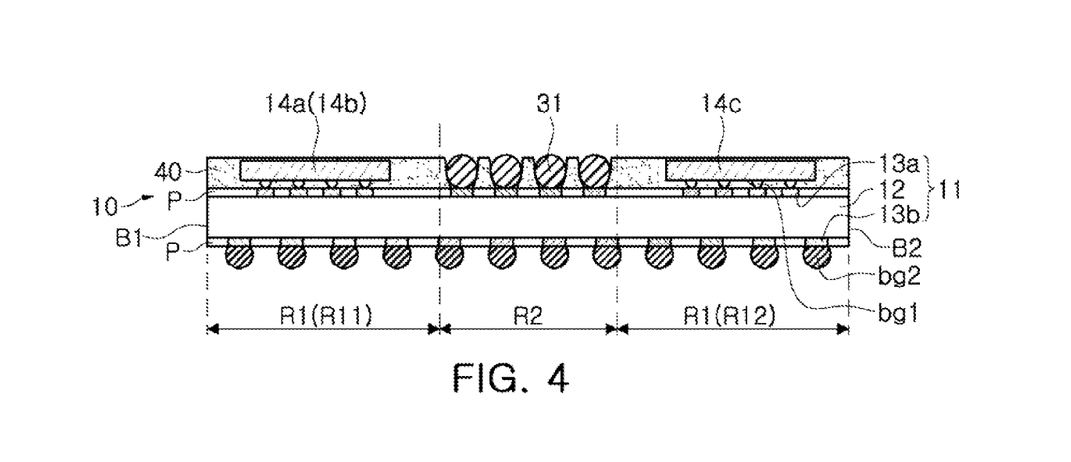

Then, as illustrated in FIGS. 3 and 4, a method of manufacturing a semiconductor package according to an exemplary embodiment of the present disclosure may include disposing a plurality of first semiconductor chips 14a, 14b and 14c and a plurality of first conductors 31 on the first circuit board 11.

FIG. 3 is a plan view of the first circuit board 11 on which the plurality of first semiconductor chips 14a, 14b and 14c and the plurality of first conductors 31 are disposed. FIG. 4 is a cross-sectional view taken along line I-I' of FIG. 3. FIG. 3 illustrates the case of omitting the encapsulating part 40 for clarity of description.

The disposing of the plurality of first semiconductor chips 14a, 14b and 14c and the plurality of first conductors 31 on the first circuit board 11 may include disposing the plurality of first semiconductor chips 14a, 14b and 14c in the first regions R1, and disposing the plurality of first conductors 31 in the second region R2. For example, two first semiconductor chips 14a and 14b may be disposed in the first sub region R11 of the first region R1, and one first semiconductor chip 14c may be disposed in the second sub region R12. For example, the size of the first semiconductor chips 14a and 14b disposed in the first sub region R11 may be smaller than that of the first semiconductor chip 14c disposed in the second sub region R12. The disposition, form, and size of the first semiconductor chips are not limited to those illustrated in this disclosure, and the number of the first semiconductor chips disposed in the respective sub regions R11 and R12, the form and the sizes thereof may be changed according to need. The plurality of first conductors 31 may be disposed in a central region of the circuit board 11 between the first semiconductor chips 14a, 14b and 14c.

The plurality of first conductors 31 may be understood as being the plurality of terminals 30 to be formed in a process described below, as illustrated in FIG. 1. Therefore, a form in which the plurality of first conductors 31 are disposed may be understood as being the same as a form in which the plurality of terminals 30 are disposed. The first conductors 31 may include solder balls, for example. The encapsulating part 40 may cover the plurality of first semiconductor chips 14a, 14b and 14c to expose the plurality of first conductors 31.

Figure 5:
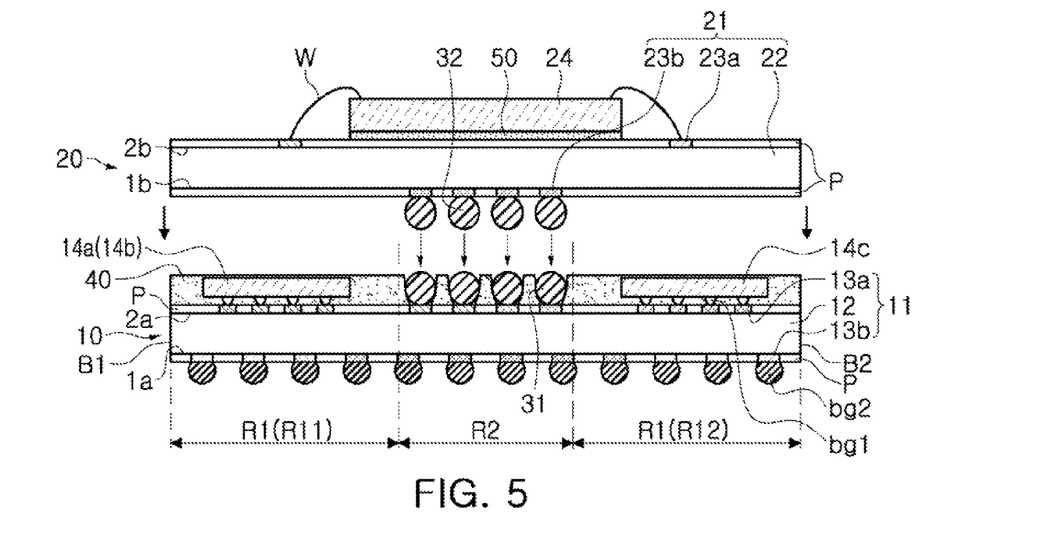

Next, as illustrated in FIG. 5, the method of manufacturing a semiconductor package according to one exemplary embodiment of the present disclosure includes disposing a second package 20 including second conductors 32 on the first package 10, and forming the plurality of terminals 30. The second circuit board 21 may include a plurality of pads (the second lower pads 23b) disposed on the first surface 1b thereof facing the first circuit board 11.

Figure 6:
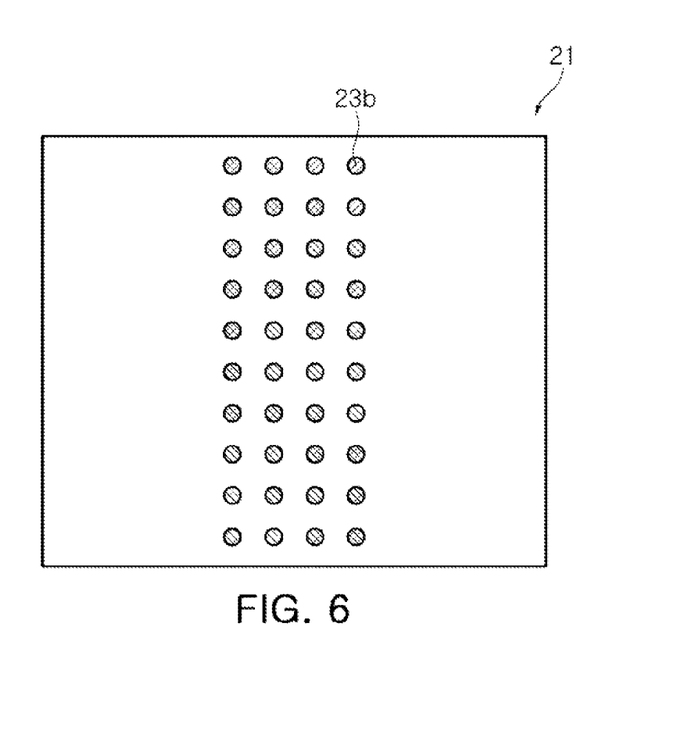

The second lower pads 23b may be disposed in positions of the second circuit board corresponding to the plurality of terminals 30 to be formed in a process described below, as illustrated in FIG. 1, for example, on positions thereof corresponding to the plurality of first conductors 31. For example, as illustrated in FIG. 3, at least portions of the plurality of second lower pads 23b may be disposed in a central region of the second circuit board 21 as illustrated in FIG. 6, to correspond to at least portions of the plurality of first conductors 31 disposed in a central region of the first circuit board 11, for example, the region R2.

Further, with reference to FIG. 5, the second conductors 32 may be disposed on the second lower pads 23b. The second conductors 32 may include a solder ball. The second conductors 32 may be integrated with the first conductors 31 to form the terminals 30 as illustrated in FIG. 1. For example, the second package 20 may be disposed on the first package 10, and the first and second conductors 31 and 32 may then be subjected to a reflow process to thereby form the plurality of terminals 30 as illustrated in FIG. 1.

As a result, the semiconductor package 501 as illustrated in FIG. 1 may be formed.

Hereinafter, an example in which the semiconductor package 501 of FIG. 1 is exposed to a thermal environment will be described in detail with reference to FIGS. 7 and 8.

Figure 7:
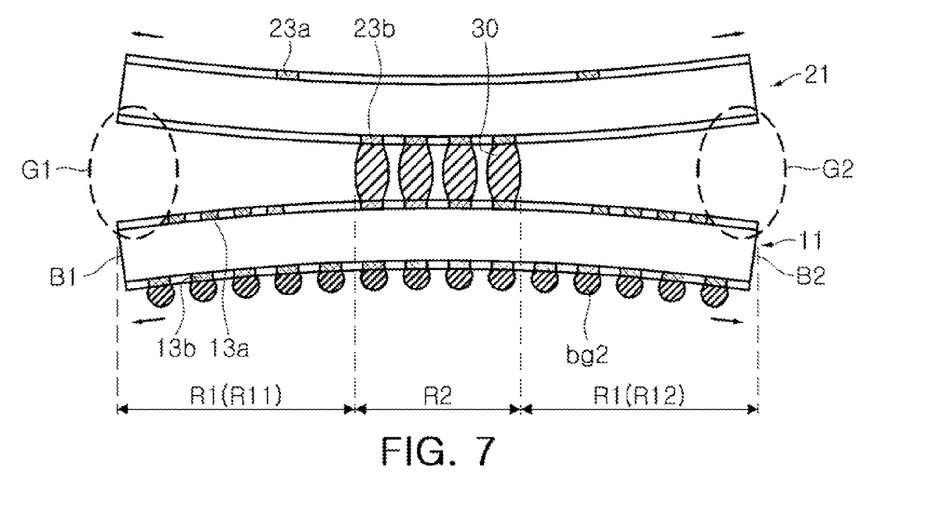
FIGS. 7 and 8 are views illustrating an example in which the semiconductor package of FIG. 1 according to an exemplary embodiment of the present disclosure is exposed to a thermal environment.
Figure 8:
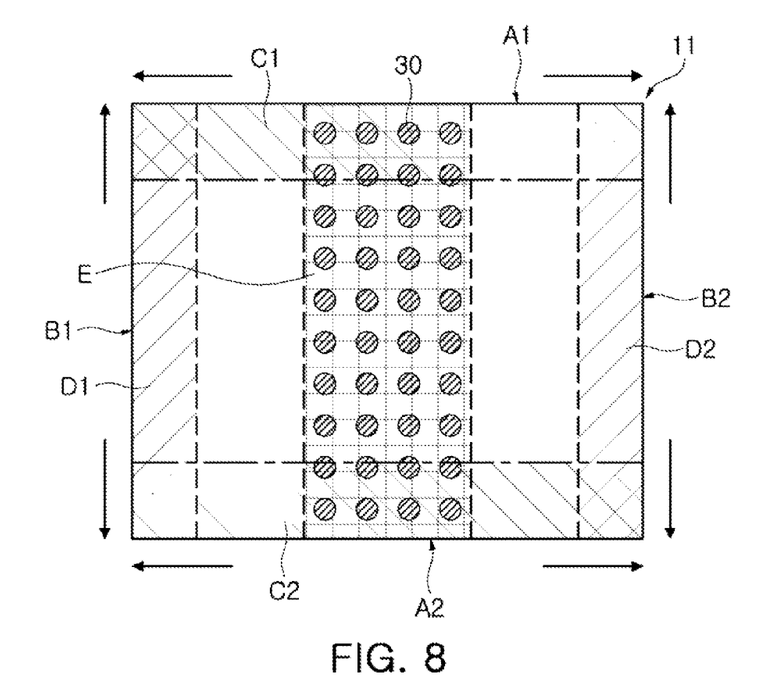

FIGS. 7 and 8 are a simplified cross-sectional views of a semiconductor package 501 of FIG. 1 and a simplified plan view of the first circuit board 11 of FIG. 3 in order to illustrate the semiconductor package 501 according to one exemplary embodiment of the present disclosure. For clearer explanations, the descriptions of configurations with the exception of first and second circuit boards 11 and 21, a plurality of terminals 30 and package bumps bg2 will be omitted.

A semiconductor package 501 according to an exemplary embodiment of the present disclosure may be exposed to a relatively high temperature depending on a manufacturing process, a use environment, or the like. In such a case, warpage may be generated in the first and second circuit boards 11 and 21 due to thermal expansion (with reference to arrows of FIGS. 7 and 8).

As the factors causing the exposure of the semiconductor package to a high temperature, for example reliability inspection such as a reflow process performed at a high temperature of about 200° C. or higher such that the first and second conductors 31 and 32 may melt and be bonded, or a temperature cycle inspection in which the semiconductor package 501 is repetitively exposed to a relatively high temperature and a relatively low temperature for a predetermined time and then electrical performance and visual defects are inspected, may be provided, but are not limited thereto.

In this case, as illustrated in FIG. 7, the circuit board may be generally transformed to a higher level at edge portions thereof since the extent of displacement due to thermal expansion becomes greater toward a sidewall of the circuit board.

Here, unlike FIG. 7, in a case in which the plurality of terminals 30 are disposed in regions G1 and G2 adjacent to sidewalls A1, A2, B1 and B2 of the first circuit board 11, bonding defects may occur in portions of the terminals.

For example, when the plurality of terminals 30 are disposed to be adjacent to sidewalls of the first circuit board 11 opposing each other with reference to FIG. 8 (for example, when the plurality of terminals 30 are disposed in regions D1 and D2 adjacent to the first and second sidewalls B1 and B2 or disposed in regions C1 and C2 adjacent to third and fourth sidewalls A1 and A2) or disposed adjacently to all of the sidewalls (disposed in the regions D1, D2, C1 and C2 adjacent to the first to fourth sidewalls B1, B2, A1 and A2), since these regions in which the plurality of terminals 30 are disposed have a relatively great amount of displacement due to thermal expansion, bonding defects may occur therein. For example, as illustrated in FIG. 5, bonding defects may occur between the first conductors 31 and the second conductors 32, or defects that the plurality of terminals 30 are detached from the first circuit board 11 or the second circuit board 21 may occur.

In order to prevent the occurrence of defects, the plurality of terminals 30 of the semiconductor package 501 according to an exemplary embodiment of the present disclosure may be disposed between the plurality of first semiconductor chips 14a, 14b and 14c. In this case, the second region R2 in which the plurality of terminals 30 are disposed may be provided between the first and second sub regions R11 and R12 of the first region R1 in which the plurality of first semiconductor chips 14a, 14b and 14c are disposed. This will be described with reference to FIG. 8. With reference to FIG. 8, the second region R2 may be a central region of the first circuit board 11, for example, region E, and the plurality of terminals 30 disposed in the central region, region E, may be less affected by thermal expansion than the regions C1, C2, D1, and D2 adjacent to the sidewalls A1, A2, B1 and B2 of the first circuit board 11. In this case, since the plurality of terminals 30 are disposed in the central region, region E, of the circuit board, in which a warpage occurrence rate is relatively low, bonding defects of the terminals may be significantly reduced. Here, although the plurality of terminals 30 are also disposed in portions of the regions C1 and C2 adjacent to the sidewalls of the first circuit board 11, bonding reliability may be improved by the disposition in which the plurality of terminals 30 are located in the central region, region E, of the circuit board, as compared to a case in which the plurality of terminals 30 are only disposed in edge regions.

Hereinafter, the form in which the plurality of terminals 30 are disposed according to an exemplary embodiment of the present disclosure will be described in further detail with reference to FIG. 3. Here, the plurality of terminals 30 may be understood as being disposed in the same positions as those of the first conductors 31 illustrated in FIG. 3.

With reference to FIG. 3, the plurality of terminals 31 according to one exemplary embodiment of the present disclosure may be disposed in the second region R2 and may also be aligned in rows and columns on the first circuit board 11, for example, in the array of n×m, where n and m are integers equal to or greater than 2. In the array of n×m, at least one of a first row and an n-th row may be adjacent to one of the third and fourth sidewalls A1 and A2 of the first circuit board 11 opposing each other, and at least one of a first column and an m-th column may be adjacent to at least one of the plurality of first semiconductor chips 14a, 14b and 14c.

For example, the terminals 31 disposed in the first row may be adjacent to the third sidewall A1 of the first circuit board 11, and the terminals 31 disposed in an n-th row may be disposed to be adjacent to the fourth sidewall A2 opposing the third sidewall A1. In addition, the terminals 31 disposed in the first column may be disposed to be adjacent to at least one side of the plurality of first semiconductor chips 14a, 14b and 14c, while the terminals 31 disposed in an m-th column may be disposed adjacently to a side of at least a different one of the plurality of first semiconductor chips 14a, 14b and 14c.

For example, the plurality of terminals 31 may be disposed in an array of 10×4, and the terminals 31 disposed in the first row may be adjacent to the third sidewall A1 of the first circuit board 11, and the terminals 31 disposed in a tenth row may be adjacent to the fourth sidewall A2 opposing the sidewall A1. In addition, the terminals 31 disposed in the first column may be disposed to be adjacent to a side of at least one first semiconductor chip 14a or 14b disposed in the first sub region R11 among the plurality of first semiconductor chips 14a, 14b and 14c, and the terminals 31 disposed in the fourth column may be disposed to be adjacent to a side of a different one semiconductor chip 14c disposed in the second sub region R12 among the plurality of first semiconductor chips 14a, 14b and 14c, but are not limited thereto.

According to one exemplary embodiment of the present disclosure, the plurality of first semiconductor chips 14a, 14b and 14c may be disposed in the first regions R1 of the first circuit board with the exception of the second region R2. As the second region R2 is provided between the first and second sub regions R11 and R12 of the first region R1, at least one sides of the plurality of respective first semiconductor chips 14a, 14b and 14c disposed in the first regions R1 may be adjacent to the first sidewall B1 or the second sidewall B2 of the first circuit board 11. For example, first sides of the plurality of first semiconductor chips 14a, 14b and 14c may be adjacent to the plurality of terminals 31, and second sides thereof opposing the first sides may be adjacent to the first sidewall B1 or the second sidewall B2 of the first circuit board 11. In this case, since at least the first sides of the plurality of first semiconductor chips 14a, 14b and 14c are adjacent to edges of the first circuit board 11, heat generated by the first semiconductor chips 14a, 14b and 14c may be easily discharged to the outside, and radiation effects may therefore be improved.

The plurality of first semiconductor chips 14a, 14b and 14c may be semiconductor devices performing different functions. For example, the plurality of first semiconductor chips 14a, 14b and 14c may include at least one of a memory chip, a logic chip and a microprocessor chip, by which the first package 10 may be implemented as a system-in-package (SIP).

For example, among the plurality of first semiconductor chips 14a, 14b and 14c, any one thereof, for example, the first semiconductor chip 14c, may be an application chip (AP chip) for driving an application program, a further semiconductor chip, for example, the first semiconductor chip 14a, may be an image processing chip, and the remaining chip, for example, the first semiconductor chip 14b may be provided as a MODEM chip, such that the first package 10 may be implemented as a single system-in-package (SIP). In addition, among the plurality of first semiconductor chips 14a, 14b and 14c, any one thereof, for example, the first semiconductor chip 14c, may be an application chip (AP chip) for driving an application program, a further semiconductor chip, for example, the first semiconductor chip 14a, may be an SRAM device, a volatile memory chip, and the remaining chip, for example, the first semiconductor chip 14b may be provided as a flash memory device, such that the first package 10 may be implemented as a single system-in-package (SIP). However, the present disclosure is not limited thereto.

Therefore, the plurality of first semiconductor chips 14a, 14b and 14c may be variously provided. Further, the plurality of first semiconductor chips 14a, 14b and 14c may be implemented as semiconductor devices performing the same function. In addition, the plurality of first semiconductor chips 14a, 14b and 14c may be implemented as a single system-in-package (SIP).

According to the exemplary embodiments of the present disclosure, a package-on-package (POP)-type semiconductor package 501 capable of significantly reducing factors deteriorating reliability in an electrical connection, for example, bonding defects in the terminals 30 connecting the first package 10 and the second package to each other may be obtained.

Figure 9:
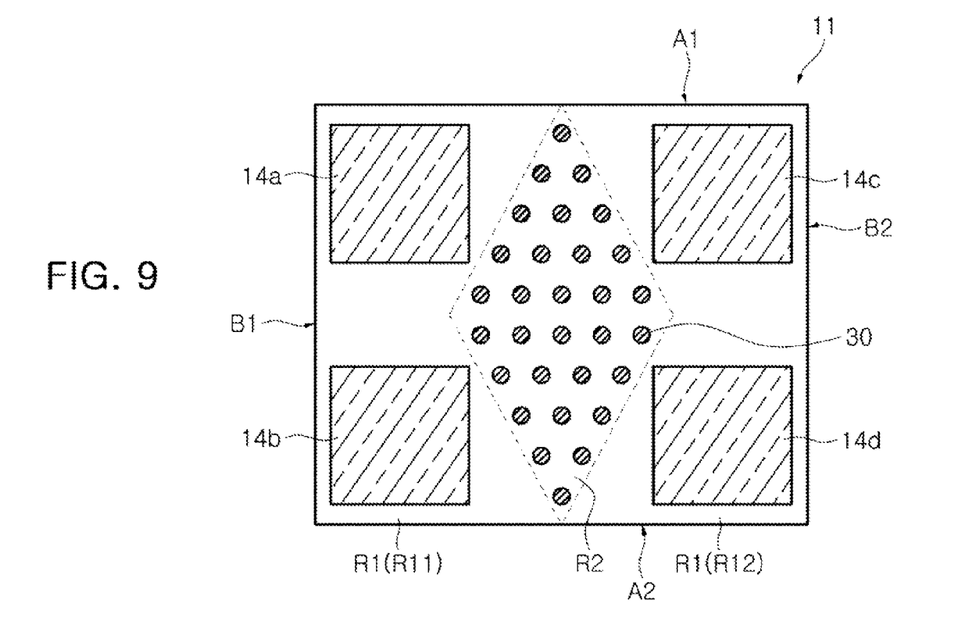
FIGS. 9 and 10 are plan views of a first package, illustrating a modified example of the semiconductor package of FIG. 1 according to an exemplary embodiment of the present disclosure.
Figure 10:
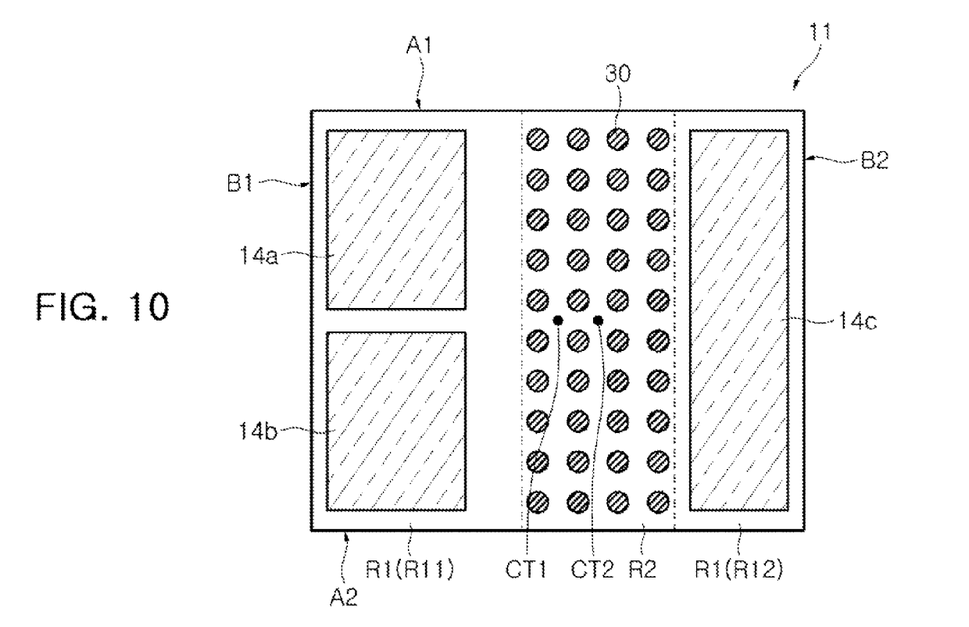

FIGS. 9 and 10 are views illustrating modified examples of the semiconductor package 501 of FIG. 1 according to certain exemplary embodiments of the present disclosure, and provide plan views of the first package 10. Hereinafter, descriptions of constituent elements overlapping with those of the constituent elements according to the foregoing exemplary embodiment of the present disclosure with reference to FIG. 1 will be omitted, and modified constituent elements will be mainly described.

With reference to FIG. 9, the number of the plurality of terminals 30 disposed on the first circuit board may increase toward a central portion of an upper surface of the first circuit board 11 compared to regions of the first circuit board 11 adjacent to the third and fourth sidewalls A1 and A2. In this case, since the number of terminals 30 disposed in the regions of the first circuit board 11 adjacent to the third and fourth sidewalls A1 and A2 is relatively small, the plurality of terminals 30 may be relatively much less influenced by thermal expansion of the third and fourth sidewalls A1 and A2 of the first circuit board 11. Problems such as bonding defects in the terminals 30 or the like may therefore be further alleviated.

In addition, a plurality of first semiconductor chips 14a, 14b, 14c and 14d may be disposed in a first region R1, a remaining region of the first circuit board 11 except for a second region R2 in which the plurality of terminals 30 are disposed, and although FIG. 9 illustrates the case in which four first semiconductor chips are provided, the present disclosure may not be limited thereto. The plurality of first semiconductor chips 14a, 14b, 14c and 14d disposed in the first package 10 may be implemented as an SIP as needed.

Further, unlike the case illustrated in FIG. 9, in the case of the second region R2 in which the plurality of terminals 30 are disposed with reference to FIG. 10, a center CT2 of the second region R2 may be spaced apart from a center CT1 of an upper surface of the first circuit board 11. Like that, a position of the second region R2 may be set in consideration of a positional relation with the plurality of first semiconductor chips 14a, 14b and 14c, and the like.

Figure 12:
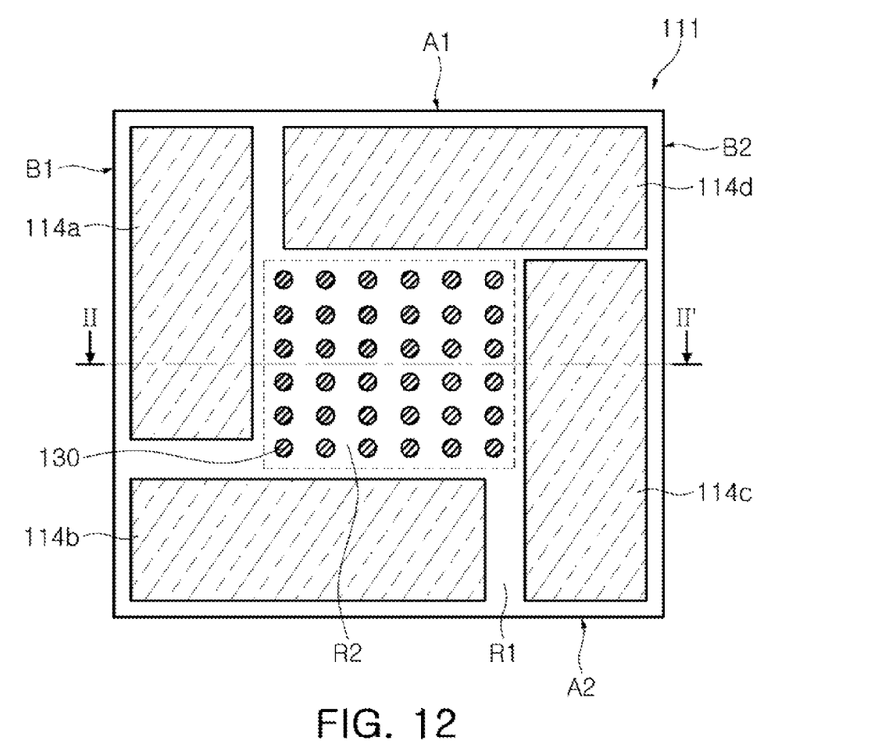

FIG. 11 is a cross-sectional view of a semiconductor package 502 according to another exemplary embodiment of the present disclosure. FIG. 12 is a plan view of a first package 110 from which an encapsulating part 40 is omitted for clearer descriptions in the semiconductor package 502 according to another exemplary embodiment of FIG. 11. FIG. 11 may be understood as being a cross-sectional view taken along line II-II' of FIG. 12.

Hereinafter, descriptions of constituent elements overlapping with those of the constituent elements according to the foregoing exemplary embodiment of the present disclosure with reference to FIG. 1 will be omitted, and modified constituent elements will be mainly described.

With reference to FIG. 11, the semiconductor package 502 according to one exemplary embodiment of the present disclosure may include a first package 110, a second package 120 and a plurality of terminals 130 electrically connecting the first and second packages 110 and 120 to each other.

The first package 110 may include a first circuit board 112, and a plurality of first semiconductor chips 114a, 114b, 114c and 114d disposed on the first circuit board 112. Here, the first circuit board 112 may include a first core insulating layer 111, first upper pads 113a and first lower pads 113b.

According to the exemplary embodiment of the present disclosure, the second package 120 may include at least one second semiconductor chip 124 flip-chip mounted on a second circuit board 121. The second semiconductor chip 124 may be electrically connected to the second circuit board 121 through chip bumps bg1. An underfill resin part u for improved bonding reliability may be disposed between the second semiconductor chip 124 and the second circuit board 121. The underfill resin part u may contain a resin such as epoxy or the like. The second circuit board 121 may include a second core insulating layer 122, second upper pads 123a and second lower pads 123b.

Referring to FIG. 12, the second region R2 may be surrounded by the first region R1. In this case, the plurality of terminals 130 disposed in the second region R2 may be disposed among the plurality of first semiconductor chips 114a, 114b, 114c and 114d, and for example, this may be understood as having a form in which the plurality of terminals 130 are actually encompassed by the plurality of first semiconductor chips 114a, 114b, 114c and 114d. Here, a plurality of outermost terminals 130 among the plurality of terminals 130 may be disposed to be adjacent to respective sides of the plurality of first semiconductor chips 114a, 114b, 114c and 114d. Although the plurality of terminals 130 are illustrated as being arrayed in an array of 6×6, they are not limited thereto, and may be disposed in an array of n×n or n×m (n and m are integers equal to or greater than 2, respectively), and may also be disposed without forming a row and a column.

The plurality of first semiconductor chips 114a, 114b 114c and 114d may be configured of semiconductor devices having different functions. Thus, the first package 110 may be implemented as a system-in-package (SIP).

For example, the plurality of first semiconductor chips may be four semiconductor chips 114a, 114b, 114c and 114d. Among the plurality of first semiconductor chips 114a, 114b, 114c and 114d, any one thereof, for example, the first semiconductor chip 114a may be an application chip (AP chip) for driving an application program, a further first semiconductor chip 114b may be an image processing chip, a further first semiconductor chip 114c may be a MODEM chip, and the remaining first semiconductor chip 114d may be a volatile memory chip, for example, an SRAM device, such that the first package 110 may be implemented as a single system-in-package (SIP). On the other hand, the first semiconductor chips 114a, 114b, 114c and 114d may be variously configured.

Figure 14:
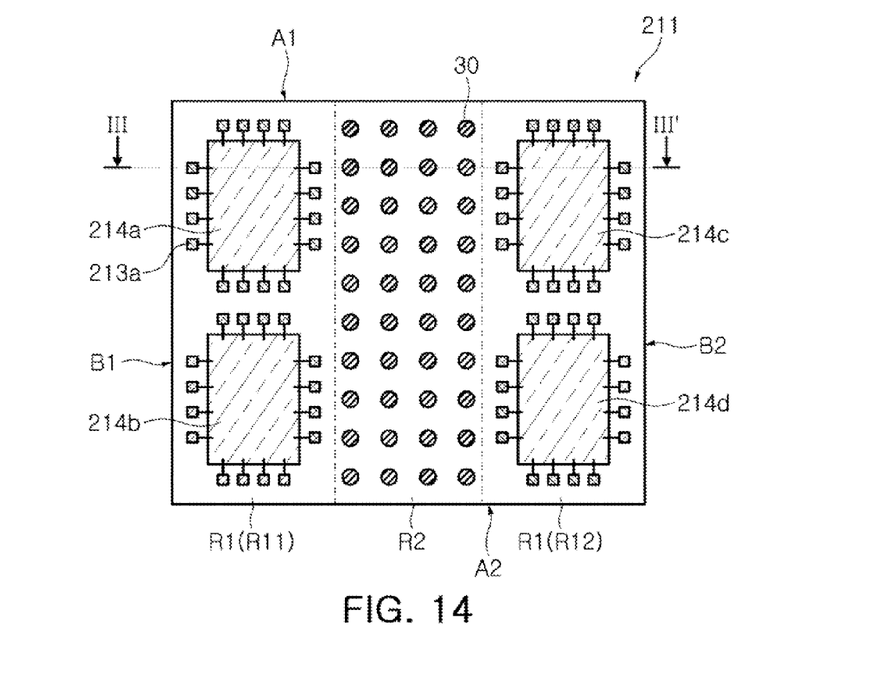
Figure 15:
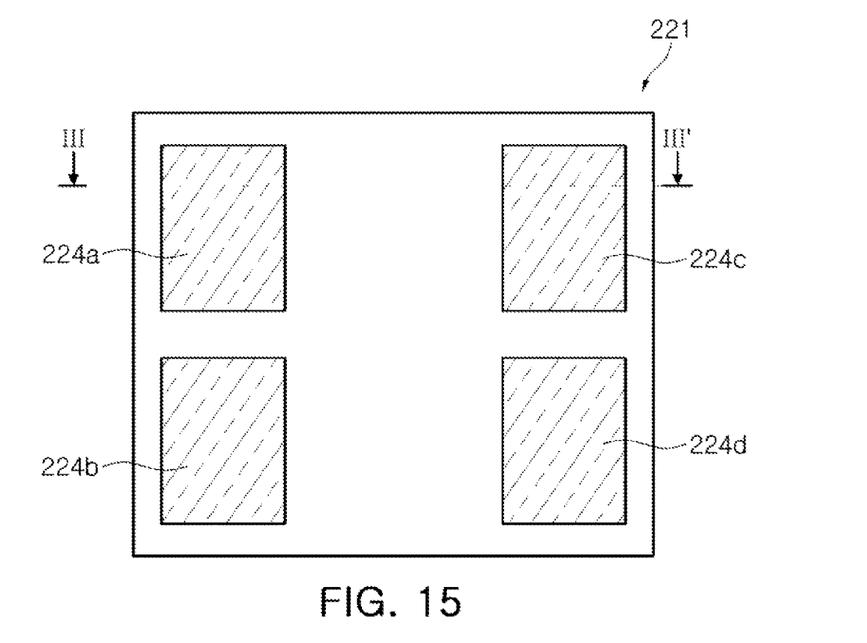

FIG. 13 is a cross-sectional view of a semiconductor package 503 according to another exemplary embodiment of the present disclosure. FIGS. 14 and 15 are plan views of a first package 210 and a second package 220 in the semiconductor package 503 according to another exemplary embodiment of the present disclosure, from which an encapsulating part 40 is omitted for clearer descriptions. FIG. 13 may be understood as being a cross-sectional view taken along line III-III' of FIGS. 14 and 15. Hereinafter, descriptions of constituent elements overlapping with those of the constituent elements according to the foregoing exemplary embodiment of the present disclosure with reference to FIG. 1 will be omitted, and modified constituent elements will be mainly described.

With reference to FIG. 13, the semiconductor package 503 according to one exemplary embodiment of the present disclosure may include a first package 210, a second package 220 and a plurality of terminals 230 electrically connecting the first and second packages 210 and 220 to each other.

With reference to FIGS. 13 and 14, the first package 210 may include a first circuit board 211, and a plurality of first semiconductor chips 214a, 214b, 214c and 214d disposed on the first circuit board 211. The first circuit board 211 may include a first core insulating layer 212, first upper pads 213a and first lower pads 213b. An adhesive portion 50 may be disposed between the first circuit board 211 and the plurality of first semiconductor chips 214a, 214b, 214c and 214d. The plurality of first semiconductor chips 214a, 214b, 214c and 214d may be electrically connected to the first circuit board 211 via wires W connected to the first upper pads 213a.

With reference to FIGS. 13 and 15, the second package 220 may include a plurality of second semiconductor chips 224a, 224b, 224c and 224d disposed on a second circuit board 221. The second circuit board 221 may include a second core insulating layer 222, second upper pads 223a and second lower pads 223b. The plurality of second semiconductor chips 224a, 224b, 224c and 224d are illustrated as being flip-chip mounted on the second circuit board, but are not limited thereto.

Similar to the disposition of the plurality of first semiconductor chips 214a, 214b, 214c and 214d, the plurality of second semiconductor chips 224a, 224b, 224c and 224d may be disposed such that at least first sides thereof may be adjacent to sidewalls of the second circuit board 221. In this case, radiation effects of the second semiconductor chips 224a, 224b, 224c and 224d may be improved.

The plurality of second semiconductor chips 224a, 224b, 224c and 224d may include at least one of a memory chip, a logic chip and a microprocessor chip, by which the second package 220 may be implemented as a system-in-package (SIP).

According to the exemplary embodiments of the present disclosure, a package-on-package (POP)-type semiconductor package 503 capable of significantly reducing factors deteriorating reliability in an electrical connection, for example, bonding defects in the terminals 230 may be obtained. In addition, the semiconductor package 503 capable of being implemented as the SIP may be obtained.

Figure 16:
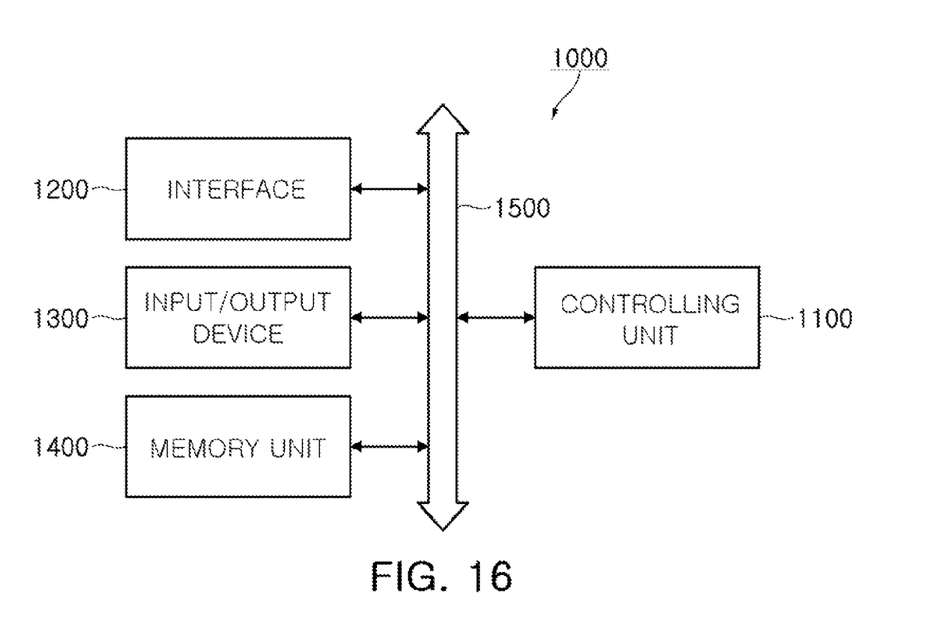
FIG. 16 is a block diagram of an electronic device including semiconductor packages according to various exemplary embodiments of the present disclosure.

FIG. 16 is a block diagram of an electronic device including semiconductor packages according to various exemplary embodiments of the present disclosure.

FIG. 16 illustrates an electronic apparatus 1000 including the semiconductor package 501, 502 or 503 according to an exemplary embodiment of the present disclosure. With reference to FIG. 16, the electronic apparatus 1000 according to the exemplary embodiments of the present disclosure may include a controlling unit 1100, an interface 1200, an input/output device 1300, a memory unit 1400, and the like. The controlling unit 1100, the interface 1200, the input/output device 1300, the memory unit 1400, and the like, may be connected to one another via a bus 1500 providing a path along which data is transferred.

The controlling unit 1100 may include at least one device such as a microprocessor, a digital signal processor, a microcontroller, or the like. The memory unit 1400 may include a device capable of reading and writing data through various schemes, and the controlling unit 1100 and the memory unit 1400 may include at least one of the semiconductor packages 501, 502 and 503 according to the foregoing, various exemplary embodiments of the present disclosure. The interface 1200 may be a module for transmitting and receiving data through a communications network, and may include an antenna, a wire or wireless transceiver, or the like. The input/output device 1300 may include a keypad, a keyboard, a touchscreen device, a display device, an audio input/output module, or the like.

Also, in addition to the configurations illustrated in FIG. 16, the electronic apparatus 1000 may further include an application chipset, an imaging device, and the like. The electronic apparatus 1000 of FIG. 16 is not limited thereto in terms of a category thereof, and may be various devices such as personal digital assistants (PDAs), portable computers, mobile phones, wireless telephones, laptop computers, portable media players, tablet personal computers, and the like.

Figure 17:
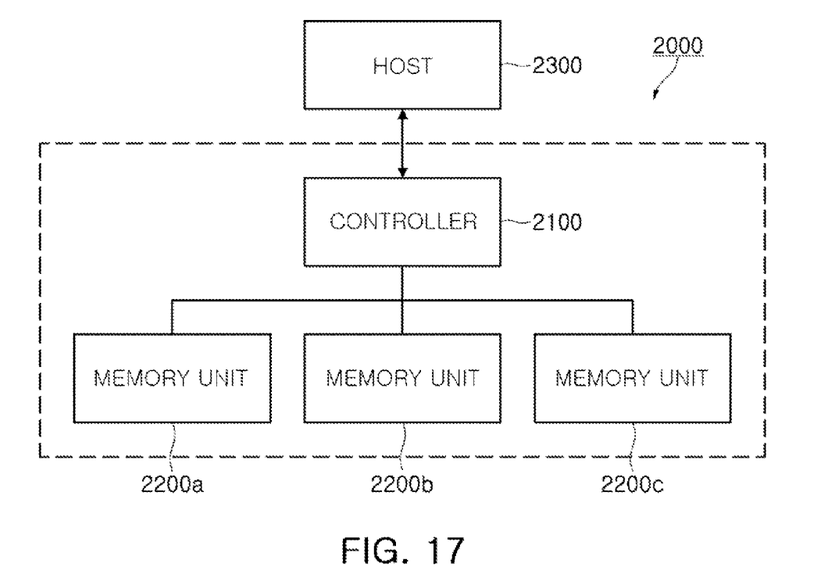
FIG. 17 is a block diagram of a storage device including semiconductor packages according to various exemplary embodiments of the present disclosure.

FIG. 17 is a block diagram of a storage device 2000 including the semiconductor package 501 or 502 according to various exemplary embodiments of the present disclosure.

With reference to FIG. 17, the storage device 2000 according to an exemplary embodiment of the present disclosure may include a controller 2100 communicating with a host 2300 and memory units 2200a, 2200b and 2200c storing data therein. The controller 2100 and the respective memory units 2200a, 2200b and 2200c may be included in at least one of the semiconductor packages 501, 502 and 503 according to the foregoing, various exemplary embodiments of the present disclosure. The host 2300 communicating with the controller 2100 may be provided as various electronic devices in which the storage device 2000 is mounted, and may be, for example, a smartphone, a digital camera, a desktop computer, a laptop computer, a media player, or the like. The controller 2100 may receive the request for writing or reading of data transferred by the host 2300 and may store the data in the memory units 2200a, 2200b and 2200c, or may generate a command CMD for reading data from the memory units 2200a, 2200b and 2200c.

According to exemplary embodiments of the present disclosure, a package-on-package (POP)-type semiconductor package capable of significantly reducing factors deteriorating reliability in an electrical connection, such as bonding defects in connection terminals between packages, or the like, may be provided.

According to exemplary embodiments of the present disclosure, a semiconductor package having improved reliability and implemented as a system-in-package (SIP) may be provided.

While exemplary embodiments have been shown and described above, it will be apparent to those skilled in the art that modifications and variations could be made without departing from the spirit and scope of the present disclosure as defined by the appended claims.

What is claimed is:

1. A semiconductor package comprising:
a plurality of first semiconductor chips mounted on a first region of a first surface of a first circuit board;
a plurality of terminals disposed between the plurality of first semiconductor chips on a second region of the first surface of the first circuit board; and
at least one second semiconductor chip mounted on a second circuit board connected to the first circuit board through the plurality of terminals,
wherein the second semiconductor chip overlaps the plurality of terminals, and
wherein the plurality of terminals are not disposed between sidewalls of the first circuit board and the first semiconductor chips.

2. The semiconductor package of claim 1, wherein the second region is surrounded by the first region.

3. The semiconductor package of claim 1, wherein a center of the first surface of the first circuit board is located in the second region.

4. The semiconductor package of claim 1, wherein first circuit board has a first sidewall and a second sidewall opposing each other, and a third sidewall and a fourth sidewall intersecting the first and second sidewalls and opposing each other.

5. The semiconductor package of claim 4, wherein the plurality of terminals are disposed in an array of rows and columns on the first circuit board.

6. The semiconductor package of claim 5, wherein a plurality of outermost terminals among the plurality of terminals are disposed to be adjacent to respective sides of the plurality of first semiconductor chips.

7. The semiconductor package of claim 5, wherein the plurality of terminals are disposed in an array of n×m, n and m being integers equal to or greater than 2, respectively, and in the array of n×m, at least one of a first row and an n-th row is adjacent to the third sidewall or the fourth sidewall of the first circuit board, and at least one of a first column and an m-th column is adjacent to at least one of the plurality of first semiconductor chips.

8. The semiconductor package of claim 4, wherein the number of the plurality of terminals disposed on the first circuit board is larger toward a central portion of the first surface of the first circuit board than in regions of the first circuit board adjacent to the third and fourth sidewalls.

9. The semiconductor package of claim 1, further comprising an encapsulating part disposed between the first circuit board and the second circuit board.

10. The semiconductor package of claim 1, wherein the plurality of terminals do not overlap the first semiconductor chips.

11. The semiconductor package of claim 4, wherein the first region comprises a first sub region adjacent to the first sidewall of the first circuit board and a second sub region adjacent to the second sidewall of the first circuit board, and
wherein the second region is disposed between the first sub region and the second sub region.

12. The semiconductor package of claim 11, wherein the plurality of first semiconductor chips comprise a first sub semiconductor chip on the first sub region and a second sub semiconductor chip on the second sub region, and wherein the first sub semiconductor chip has a size different from the size of the second sub semiconductor chip.

13. The semiconductor package of claim 12, wherein the plurality of first semiconductor chips further comprise a third sub semiconductor chip on the first sub region, and
wherein a size of the third sub semiconductor chip is smaller than a size of the second sub semiconductor chip.

14. The semiconductor package of claim 12, wherein the second semiconductor chip overlaps the second region and a part of the first region.

15. The semiconductor package of claim 12, wherein a width of the second semiconductor chip is greater than a width of the second region.

16. The semiconductor package of claim 15, wherein a length of the second region is greater than the width of the second region.

17. The semiconductor package of claim 4, wherein the plurality of terminals are closer to the third and fourth sidewalls of the first circuit board than the first and second sidewalls of the first circuit board.

18. A semiconductor package comprising:
a first package including a plurality of first semiconductor chips and a plurality of terminals horizontally disposed on a first circuit board to be spaced apart from one another; and
a second package mounted on the first package and including at least one second semiconductor chip disposed on a second circuit board,
wherein the plurality of terminals are electrically connected to the first and second packages, and at least portions of the plurality of terminals are disposed in a central region of the first circuit board,
wherein the plurality of terminals are in contact with the first circuit board and the second circuit board,
wherein the second semiconductor chip overlaps the plurality terminals, and
wherein the plurality of terminals are not disposed between sidewalls of the first circuit board and the first semiconductor chips.

19. A semiconductor package comprising:
a first package including a first circuit board, and including a plurality of first semiconductor chips horizontally disposed on the first circuit board to be spaced apart from one another;
a second package disposed on the first package and including a second circuit board and at least one second semiconductor chip disposed on the second circuit board; and
a plurality of terminals electrically connected to the first and second packages, the plurality of terminals disposed on the first circuit board and encompassed by the plurality of first semiconductor chips in a manner such that a plurality of outermost terminals among the plurality of terminals are disposed to be adjacent to respective sides of the plurality of first semiconductor chips.

* * * * *